US008683677B2

(12) United States Patent
Alisantoso et al.

(10) Patent No.: US 8,683,677 B2
(45) Date of Patent: Apr. 1, 2014

(54) METHODS FOR BALANCING A DISK DRIVE

(75) Inventors: Darius Alisantoso, Singapore (SG);
Terence Cheekwong Cheng, Singapore (SG); S Selvaruban, Singapore (SG);
Sok Li Goh, Singapore (SG)

(73) Assignee: Seagate Technology, Cupertino, CA (US)

( * ) Notice: Subject to any disclaimer, the term of this patent is extended or adjusted under 35 U.S.C. 154(b) by 0 days.

(21) Appl. No.: 13/596,452

(22) Filed: Aug. 28, 2012

(65) Prior Publication Data

US 2014/0063654 A1   Mar. 6, 2014

(51) Int. Cl.
*G11B 5/127* (2006.01)
*H04R 31/00* (2006.01)
*G01R 3/00* (2006.01)
*G01R 17/02* (2006.01)
*G01R 17/08* (2006.01)
*G11B 7/09* (2006.01)

(52) U.S. Cl.
CPC . *G01R 3/00* (2013.01); *G01R 17/02* (2013.01); *G01R 17/08* (2013.01); *G11B 7/094* (2013.01); *G11B 7/0945* (2013.01)
USPC ......... 29/603.03; 29/593; 29/603.07; 29/739; 360/98.08; 360/99.05; 360/99.12

(58) Field of Classification Search
CPC ........ G11B 7/00; G11B 7/094; G11B 7/0945;
G11B 7/125; G11B 19/2027; G11B 25/043;
G11B 33/08; G01R 3/00; G01R 17/02;
G01R 17/08
USPC .......... 29/603.03, 603.04, 603.07; 360/97.02,
360/98.08, 99.05, 99.12
See application file for complete search history.

(56) References Cited

U.S. PATENT DOCUMENTS

| 6,542,330 | B1 | 4/2003 | Choo et al. |
| 6,651,311 | B1* | 11/2003 | Kim et al. .................. 29/603.03 |
| 6,897,393 | B1* | 5/2005 | Codilian et al. ............. 209/571 |
| 7,209,320 | B1* | 4/2007 | Woods et al. .............. 360/99.12 |
| 7,230,728 | B2 | 6/2007 | Su et al. |
| 7,724,468 | B2 | 5/2010 | Fu et al. |
| 7,926,167 | B1 | 4/2011 | Liebman et al. |
| 2010/0053805 | A1* | 3/2010 | Oh et al. .................... 360/98.07 |
| 2011/0188155 | A1 | 8/2011 | Lee et al. |

* cited by examiner

*Primary Examiner* — Paul D Kim
(74) *Attorney, Agent, or Firm* — Braden Katterheinrich

(57) ABSTRACT

In certain embodiments, a hard disk drive includes at least one disk secured to a motor hub with a disk clamp. The disk clamp is positioned radially off-center with respect to the hub to balance a static drive imbalance.
In certain embodiments, a method includes radially offsetting a disk clamp to offset a static drive balance.

10 Claims, 4 Drawing Sheets

METHODS FOR BALANCING A DISK DRIVE

SUMMARY

Certain embodiments of the present disclosure are generally directed to methods and devices for balancing a disk drive.

In certain embodiments, a hard disk drive includes at least one disk secured to a motor hub with a disk clamp. The disk clamp is positioned radially off-center with respect to the hub to balance a static drive imbalance.

In certain embodiments, a method includes radially offsetting a disk clamp to offset a static drive balance.

DETAILED DESCRIPTION

The present disclosure relates to devices, systems, and methods for offsetting or balancing a static drive imbalance. A hard disk drive's static imbalance can be caused by several imbalances. One such imbalance is a disk imbalance where a disk is not concentric with a motor hub, and as a result, causes an imbalance. Another imbalance that contributes to a drive's overall static imbalance is a clamp imbalance—resulting when a disk clamp is not concentric with a motor hub. Motor imbalances also can contribute to a drive's static imbalance. A motor imbalance is generated when a motor's center of rotation does not match a motor's center of gravity.

The aforementioned imbalances contribute to a drive's static imbalance and can affect drive performance. For example, imbalances can generate eccentric loads, which can cause misalignment errors when reading data from and writing data to a disk in a hard disk drive. Imbalances may also generate vibration and noise. Static imbalance can vary from drive to drive and can be unpredictable. Certain embodiments of the present disclosure are accordingly directed to systems, devices, and methods for offsetting a hard disk drive's static imbalance.

Figure 1:
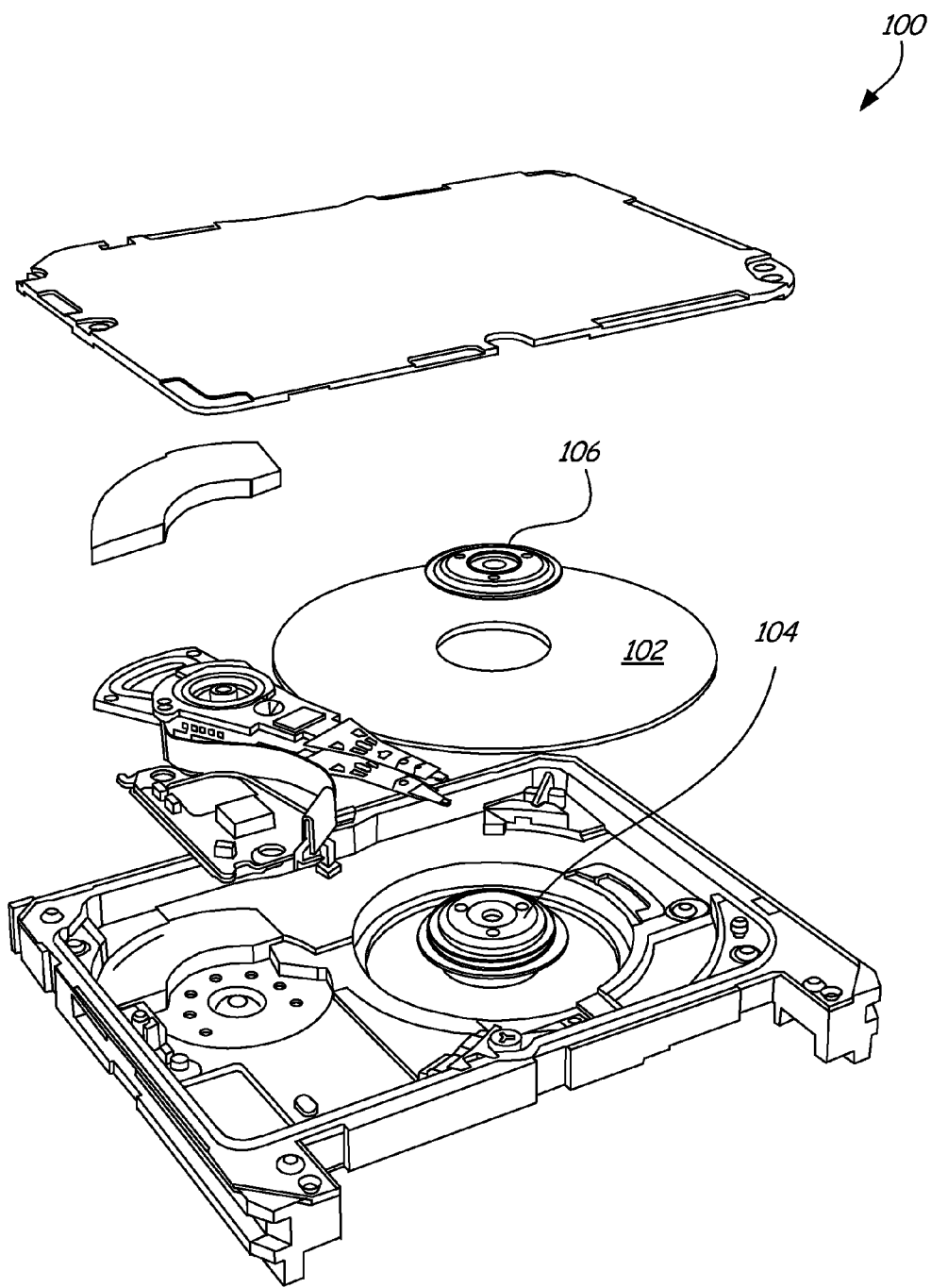
FIG. 1 provides an exploded, perspective view of a hard disk drive, in accordance with certain embodiments of the present disclosure.

FIG. 1 provides an exploded perspective view of a hard disk drive 100 having a disk 102, motor 104, and disk clamp 106. Only one disk is shown, but hard drives can employ a number of disks. The disk 102 is secured to the motor 104 by the disk clamp 106 so that, during operation, the disk 102 rotates with the motor 104. The disk clamp 106 can be secured to the motor 104 by fasteners such as screws. For example, the motor 104 and disk clamp 106 in FIG. 1 are each shown as having three areas for receiving fasteners.

Figure 2:
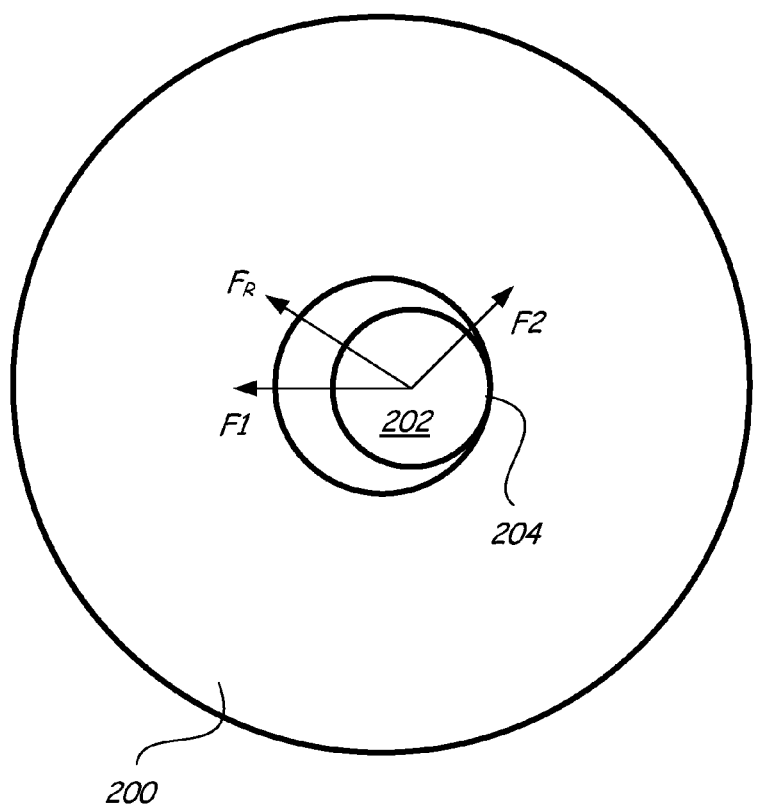
FIG. 2 provides a top view of a disk and motor, in accordance with certain embodiments of the present disclosure.

FIG. 2 shows a top view of a disk 200 and a motor hub 202. As shown, the disk 200 is biased against the motor hub 202. Specifically, a portion of an inner diameter 204 of the disk 200 sits against the motor hub 202 causing the disk 200 to be eccentric to the motor hub 202. This eccentricity contributes to a static imbalance of a disk drive.

In FIG. 2, examples of imbalances are represented by arrows (F1 and F2) where a length of each arrow's tail is a magnitude of an imbalance and each arrow's direction is a direction of an imbalance. An overall static drive imbalance is represented by a resultant arrow ($F_R$). These arrows are just examples and it should be recognized that magnitudes and directions of static imbalances can vary from drive to drive. Typically, the magnitude and direction of the magnitude is unknown until a disk or disks are secured to a motor hub. The resultant ($F_R$) represents a vector summation of various drive imbalances. For example, if a drive has multiple disks, the resultant would represent a vector summation that includes imbalances resulting from each disk's eccentricity. Below is a discussion of how the imbalances are calculated and used to balance a drive.

Figure 3:
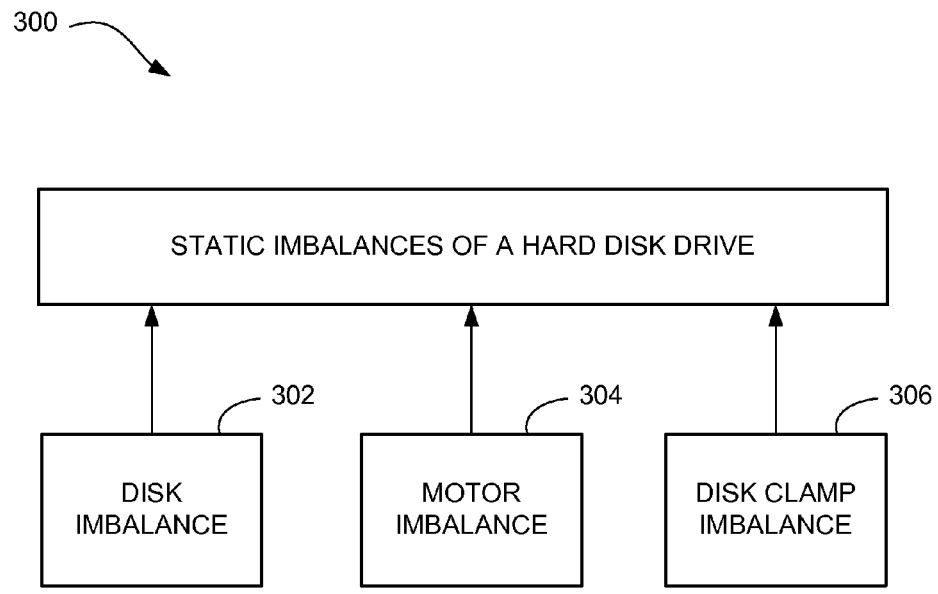
FIG. 3 provides a block diagram, in accordance with certain embodiments of the present disclosure.

FIG. 3 shows a block diagram 300 of static imbalances, including a disk imbalance 302, motor imbalance 304, and a clamp imbalance 306. Other imbalances and multiple imbalances of those specifically discussed can contribute to a drive's static imbalance, but for simplicity's sake, only three imbalances are discussed. Each imbalance has a magnitude and a direction. For example, the disk imbalance 302 has a magnitude—measured, for example, in units of mass*distance—that is a function of a mass of the disk and an eccentricity of the disk with relation to a motor hub. The direction of the imbalance can be measured, for example, with respect to a section of the disk, such as a known line or mark on the disk. The motor imbalance 304 can include a magnitude that is measured in units of mass*distance and a direction of the imbalance, which can vary from motor to motor. A magnitude of the clamp imbalance 306 is a function of a mass of the disk clamp and an eccentricity of the disk clamp with relation to the motor hub. As will be discussed below, the direction of the clamp imbalance 306 can be aligned opposite of a direction of a resultant of the disk imbalance 302 and the motor imbalance 304 as part of the balancing process.

Figure 4:
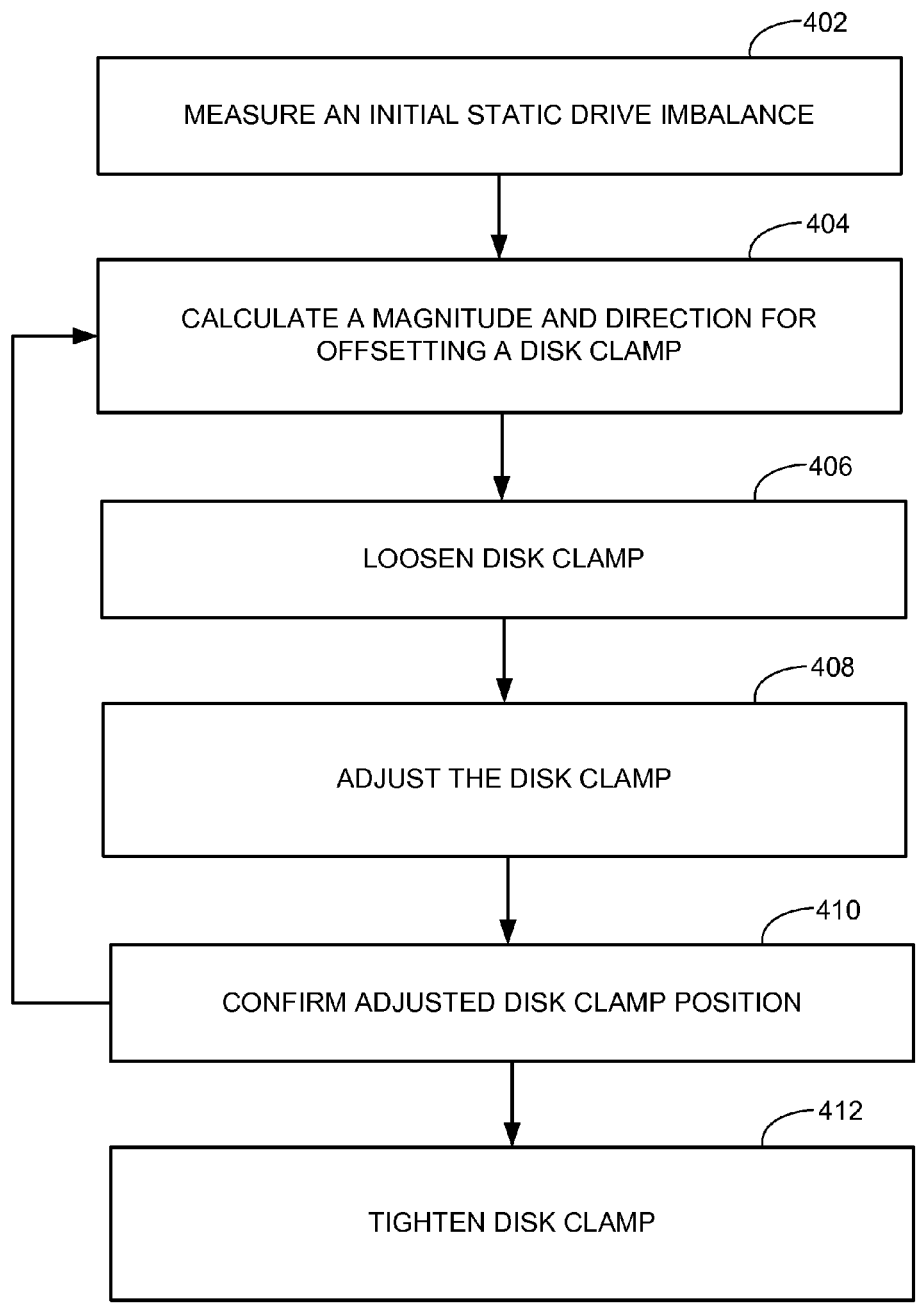
FIG. 4 provides a block diagram, in accordance with certain embodiments of the present disclosure.

FIG. 4 shows a block diagram 400 including steps for offsetting a hard disk drive's static imbalance. Step 402 includes measuring an initial static imbalance of a hard disk drive. The initial static imbalance can be due to disk imbalances, motor imbalances, and disk clamp imbalances, or a combination of some or all of them, among others. The initial static imbalance can be in the form of a vector summation, resulting in a known magnitude and direction of the initial static imbalance.

Step 404 includes calculating a magnitude and direction for offsetting the disk clamp to balance the measured static drive imbalance. The direction of the offset can be 180° from the direction of the initial static imbalance. An offset distance can be calculated by dividing the magnitude of the initial static imbalance by a mass of the clamp. Step 406 includes loosening the disk clamp, which can include untightening fasteners.

Step 408 includes adjusting the disk clamp to offset the static drive imbalance. This can be accomplished by utilizing an end effector of a robotic arm, among other methods. As a result of the adjustment, the disk clamp may intentionally be positioned off-center or eccentric with relation to a motor hub. Although the disk clamp may be positioned off-center, the positioning is done to offset imbalances caused by other factors. Step 410 includes confirming the adjusted disk clamp position, which can be performed by a vision machine among other measurement methods. If the disk clamp is positioned correctly, then the disk clamp can be tightened (step 412). If not, certain steps can be repeated until the disk clamp is in the desired position.

The steps described above permit a drive's static imbalance to be offset by adjusting a disk clamp's position. So, although the disk clamp may be eccentric with respect to the motor hub, it is done intentionally to offset static imbalances caused by other factors, such as disk and motor imbalances.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
    measuring an initial static drive imbalance that includes a magnitude and direction of a disk imbalance and a motor imbalance; and
    radially offsetting a disk clamp with respect to a motor hub to offset the measured static drive imbalance.

2. The method of claim 1, wherein the disk clamp is radially offset in a direction opposite the direction of the measured initial static drive imbalance.

3. The method of claim 1, further comprising:
    after the radially offsetting step, measuring a static drive imbalance a second time.

4. The method of claim 3, further comprising:
    if the disk clamp is not in a desired radially offset position, radially offsetting the disk clamp a second time.

5. The method of claim 3, further comprising:
    tightening fasteners to secure the disk clamp to a motor.

6. The method of claim 1, wherein the disk imbalance and motor imbalance are offset by a disk clamp imbalance.

7. A method comprising:
    measuring a motor imbalance and disk imbalance;
    calculating a resultant of the measured motor and disk imbalances; and
    offsetting a disk clamp in an opposite direction of the calculated resultant to offset the motor and disk imbalances.

8. The method of claim 7, further comprising:
    biasing a disk against a motor hub.

9. The method of claim 8, further comprising:
    securing the disk clamp to a motor.

10. The method of claim 7, wherein the disk clamp is offset by a distance calculated by dividing a magnitude of the resultant static drive imbalance by a mass of the disk clamp.

* * * * *